(12) United States Patent
Ren et al.

(10) Patent No.: US 12,520,639 B2
(45) Date of Patent: Jan. 6, 2026

(54) LIGHT-EMITTING PANEL, DISPLAY DEVICE, AND BACKLIGHT MODULE

(71) Applicant: Shanghai Tianma Microelectronics Co., Ltd., Shanghai (CN)

(72) Inventors: Fengbin Ren, Shanghai (CN); Kexiong Zhou, Shanghai (CN); Ronghua Li, Shanghai (CN); Hui Liu, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 376 days.

(21) Appl. No.: 18/231,833

(22) Filed: Aug. 9, 2023

(65) Prior Publication Data

US 2023/0387364 A1    Nov. 30, 2023

(30) Foreign Application Priority Data

Feb. 2, 2023   (CN) .......................... 202310093833.6

(51) Int. Cl.
*H10H 20/856*  (2025.01)
*H01L 25/075*  (2006.01)

(52) U.S. Cl.
CPC ....... *H10H 20/856* (2025.01); *H01L 25/0753* (2013.01)

(58) Field of Classification Search
CPC ............... H10H 20/856; H10H 20/855; G02F 1/133603; G02F 1/133605; H01L 25/0753; G09F 9/33
See application file for complete search history.

(56) References Cited

U.S. PATENT DOCUMENTS

| | | | | |
|---|---|---|---|---|
| 2022/0216265 A1* | 7/2022 | Liu | ...................... | H10H 29/142 |
| 2023/0059512 A1* | 2/2023 | Chen | ..................... | H10H 20/01 |
| 2023/0420625 A1* | 12/2023 | Zhao | .................... | H10H 20/857 |
| 2024/0154071 A1* | 5/2024 | Deng | .................... | H01L 25/167 |

FOREIGN PATENT DOCUMENTS

| | | |
|---|---|---|
| CN | 106297674 A | 1/2017 |
| CN | 109491146 A | 3/2019 |
| CN | 210690995 U | 6/2020 |
| CN | 114236908 A | 3/2022 |
| CN | 114253029 A | 3/2022 |

* cited by examiner

*Primary Examiner* — Kevin Quarterman
(74) *Attorney, Agent, or Firm* — KDW Firm PLLC

(57) ABSTRACT

Provided are a light-emitting panel, a display device, and a backlight module. The light-emitting panel includes a driving substrate and multiple light-emitting elements located on a side of the driving substrate. The multiple light-emitting elements include first light-emitting elements on a side of the driving substrate close to an edge of the driving substrate. The minimum distance between the first light-emitting elements and the edge of the driving substrate is L1, and the minimum distance between two adjacent light-emitting elements is L2, where $0<L1\leq L2/2$.

20 Claims, 13 Drawing Sheets

LIGHT-EMITTING PANEL, DISPLAY DEVICE, AND BACKLIGHT MODULE

CROSS-REFERENCE TO RELATED APPLICATION

This application claims priority to Chinese Patent Application No. CN2023100938336, filed on Feb. 2, 2023, the disclosure of which is incorporated herein by reference in its entirety.

TECHNICAL FIELD

Embodiments of the present disclosure relate to the field of display technology and, in particular, to a light-emitting panel, a display device, and a backlight module.

BACKGROUND

Display technology is widely applied to electronic products such as televisions and mobile phones. The electronic products display rich and colorful images, which greatly facilitates people's life.

However, in the working process of the existing display device, the edge brightness of the display device is insufficient affecting the normal display of the display device.

SUMMARY

Embodiments of the present disclosure provide a light-emitting panel, a display device, and a backlight module, in which the distance between each first light-emitting element and the edge of a driving substrate is set to be less than half of the minimum distance between any two adjacent light-emitting elements to reduce the brightness difference of the entire light-emitting panel and ensure the light output uniformity of the light-emitting panel.

In a first aspect, an embodiment of the present disclosure provides a light-emitting panel. The light-emitting panel includes a driving substrate and multiple light-emitting elements located on a side of the driving substrate.

The multiple light-emitting elements include first light-emitting elements on a side of the driving substrate close to an edge of the driving substrate. The minimum distance between the first light-emitting elements and the edge of the driving substrate is L1, and the minimum distance between two adjacent light-emitting elements is L2, where $0<L1\leq L2/2$.

In a second aspect, an embodiment of the present disclosure provides a display device. The device includes the light-emitting panel described in the first aspect.

In a third aspect, an embodiment of the present disclosure provides a backlight module. The module includes the light-emitting panel described in the first aspect.

In a fourth aspect, an embodiment of the present disclosure provides a display device. The device includes the backlight module described in the third aspect and a display panel located on the light output side of the backlight module.

The display panel includes a display region. The orthographic projection of a light-emitting element in the display panel coincides with the display region.

BRIEF DESCRIPTION OF DRAWINGS

To more clearly illustrate the technical solutions in the example embodiments of the present disclosure, a brief introduction to the drawings required in the description of the embodiments is given below. Apparently, the drawings are merely drawings of part, not all, of the embodiments of the present disclosure to be described, and those of ordinary skill in the art may obtain other drawings according to the drawings described below on the premise that no creative work is done.

DETAILED DESCRIPTION

To make the objects, solutions and advantages of the present disclosure clearer, the solutions of the present disclosure are completely described below in conjunction with the specific embodiments and the drawings in embodiments of the present disclosure. Apparently, the embodiments described herein are part, not all, of the embodiments of the present disclosure, and based on the embodiments of the present disclosure, all other embodiments obtained by those skilled in the art on the premise that no creative work is done are within the scope of the present disclosure.

It is to be noted that the terms "first", "second" and the like in the description, claims and drawings of the present disclosure are used to distinguish between similar objects and are not necessarily used to describe a particular order or sequence. It should be understood that the data used in this way is interchangeable where appropriate so that the embodiments of the present disclosure described herein can also be implemented in a sequence not illustrated or described herein. In addition, the terms "comprising", "including" or any other variations thereof herein are intended to encompass a non-exclusive inclusion. For example, a system, product, or device that includes a series of units not only includes those expressly listed steps or units but may also include other units that are not expressly listed or are inherent to such product or device.

Figure 1:
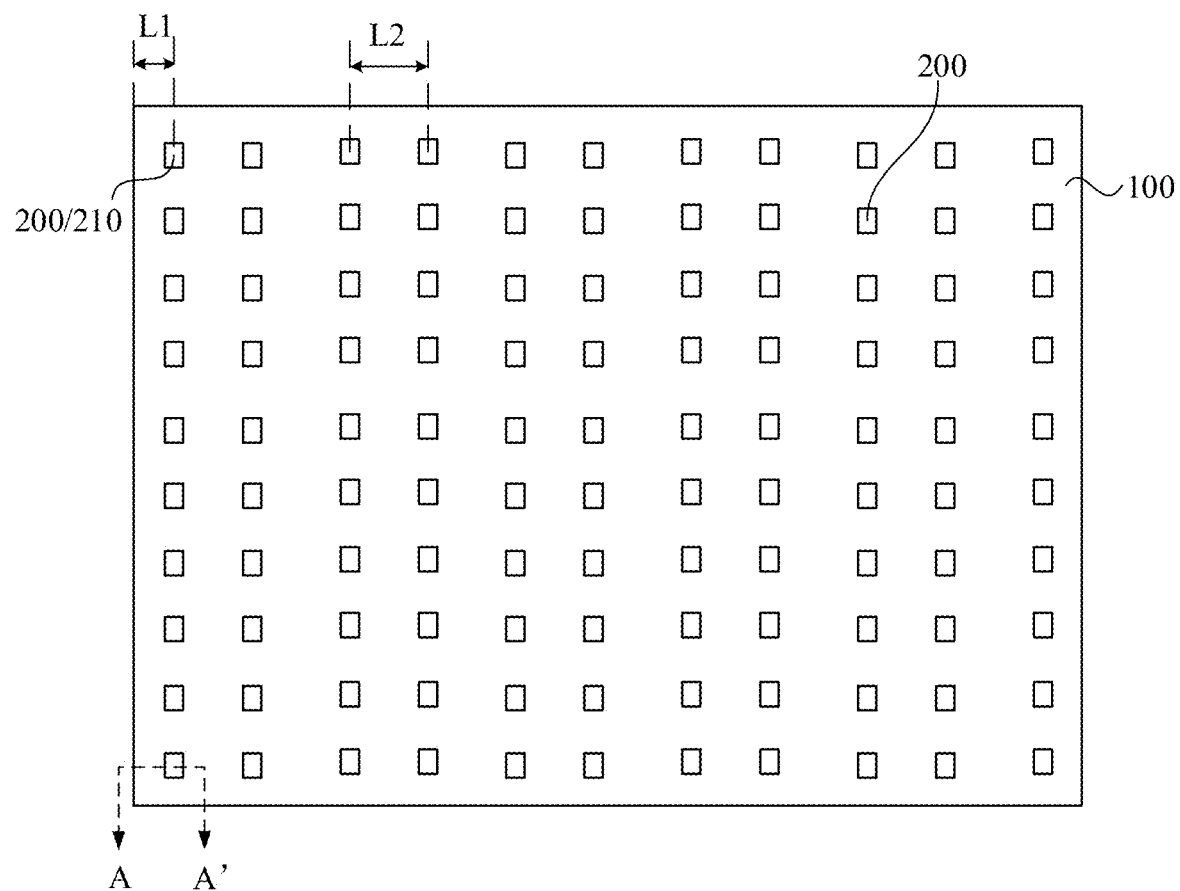
FIG. 1 is a diagram illustrating the structure of a light-emitting panel according to an embodiment of the present disclosure.
Figure 2:
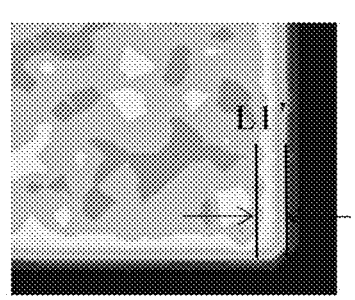
FIG. 2 is a diagram of the light-emitting effect of a light-emitting panel in the related art.
Figure 3:
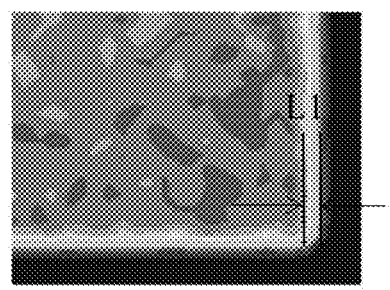
FIG. 3 is a diagram of the light-emitting effect of a light-emitting panel according to an embodiment of the present disclosure.
Figure 4:
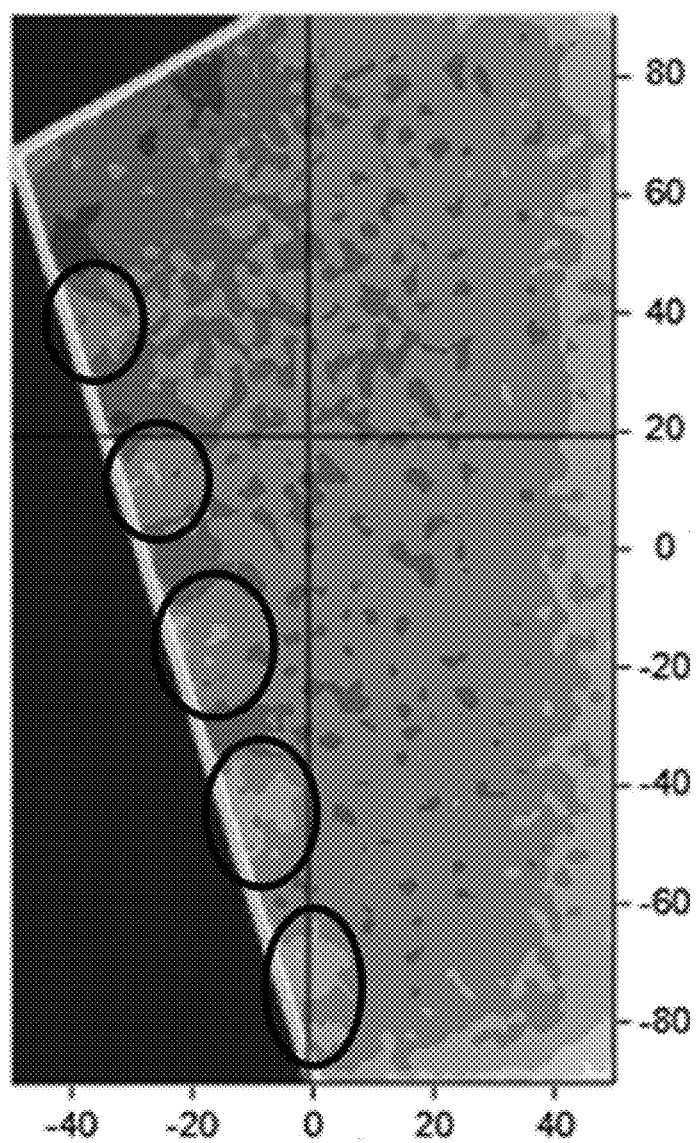
FIG. 4 is a diagram of the simulation effect of a light-emitting panel in the related art.
Figure 5:
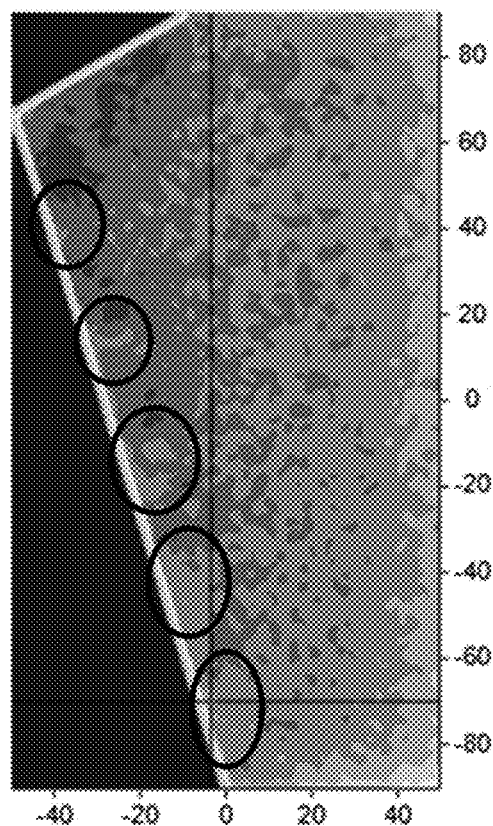
FIG. 5 is a diagram of the simulation effect of a light-emitting panel according to an embodiment of the present disclosure.

FIG. 1 is a diagram illustrating the structure of a light-emitting panel according to an embodiment of the present disclosure. FIG. 2 is a diagram of the light-emitting effect of a light-emitting panel in the related art. FIG. 3 is a diagram of the light-emitting effect of a light-emitting panel according to an embodiment of the present disclosure. FIG. 4 is a diagram of the simulation effect of a light-emitting panel in the related art. FIG. 5 is a diagram of the simulation effect of a light-emitting panel according to an embodiment of the present disclosure. With reference to FIGS. 1 to 5, an embodiment of the present disclosure provides a light-emitting panel 10. The light-emitting panel 10 includes a driving substrate 100 and multiple light-emitting elements 200 located on a side of the driving substrate 100. The multiple light-emitting elements 200 include first light-emitting elements 210 on a side of the driving substrate 100 close to an edge of the driving substrate 100. The minimum distance between the first light-emitting elements 210 and the edge of the driving substrate 100 is L1, and the minimum distance between two adjacent light-emitting elements 200 is L2, where $0 < L1 \leq L2/2$.

In an embodiment, the light-emitting panel 10 includes a driving substrate 100 and multiple light-emitting elements 200 located on the side of the driving substrate 100. The light-emitting elements 200 emit light to implement the light-emitting effect of the light-emitting panel 10. For example, the light emitting of the light-emitting panel 10 may be used to implement the display effect of a display device and may also be used to implement the backlight effect of a backlight module. This is not limited in the embodiments of the present disclosure.

Further, the light-emitting elements 200 also include first light-emitting elements 210. With reference to FIG. 1, the first light-emitting elements 210 are close to the side of the edge of the driving substrate 100, that is, the first light-emitting elements 210 are more close to the edge of the light-emitting panel 10. It is to be noted that the first light-emitting elements 210 close to the edge of the driving substrate 100 are only different from the other light-emitting elements 200 in an arrangement position, but the type and size of the light-emitting elements 200 are the same, so that the overall light-emitting effect of the light-emitting panel 10 is ensured to be consistent. This is not limited in the embodiments of the present disclosure.

Optionally, the light-emitting elements 200 include micro light-emitting elements.

Further, the light-emitting elements 200 included in the light-emitting panel 10 may be micro light-emitting diodes or mini light-emitting diodes. The light-emitting panel 10 adopting micro light-emitting diodes or mini light-emitting diodes has many advantages such as self light emitting, a low drive voltage, high light-emitting efficiency, a short response time, high definition, and high contrast. Moreover, since the size of a micro light-emitting diode or a mini light-emitting diode is small, a light-emitting element 200 is configured to include a micro light-emitting diode or a mini light-emitting diode, so that more light-emitting elements can be disposed in the same light-emitting region, thereby improving the light-emitting resolution of the light-emitting panel. For example, the size of a mini light-emitting diode is between 100 microns and 500 microns, and the size of a micro light-emitting diode may be less than 100 microns. This is not limited in the embodiments of the present disclosure.

Optionally, the minimum distance between the first light-emitting elements 210 and the edge of the driving substrate 100 is L1, and the minimum distance between two adjacent light-emitting elements 200 is L2. The distance satisfies $0 < L1 \leq L2/2$. With continued reference to FIGS. 2 and 3, in the light-emitting panel 10 provided by the embodiments of the present disclosure, compared with the light-emitting panel of the related art, the distance between the first light-emitting elements 210 and the edge of the driving substrate 100 is reduced, that is, L1' in FIG. 2 is greater than L1 in FIG. 3. With continued reference to FIGS. 4 and 5, in the light-emitting panel 10 provided by the embodiments of the present disclosure, the brightness of an edge increases. With continued reference to multiple circular regions shown in FIGS. 4 and 5, it can be seen from the diagram of the simulation effect that the brightness of the circular region in FIG. 5 is greater than the brightness of the relative circular region in FIG. 4, that is, the light-emitting effect of the edge region of the light-emitting panel 10 according to the embodiments of the present disclosure is improved. In other words, the distance between the first light-emitting elements 210 and the edge of the driving substrate 100 is set to be less than half of the minimum distance between any two adjacent light-emitting elements 200, that is, the distance between the light-emitting elements 200 and the edge of the driving substrate 100 may be reduced, so that the edge of the light-emitting panel 10 is prevented from being unable to acquire sufficient brightness due to the long distance from the light-emitting elements 200, thereby ensuring that the brightness of the edge of the light-emitting panel 10 is relatively high, and at the same time, avoiding the case where the brightness of the edge region of the light-emitting panel 10 is low but the brightness of the middle region of the light-emitting panel is high. In this manner, the brightness difference of the entire light-emitting panel 10 is reduced, and the light output uniformity of the light-emitting panel is ensured, thereby ensuring the light-emitting effect of the light-emitting panel 10.

In conclusion, in the light-emitting panel provided by the embodiments of the present disclosure, the distance between each of the first light-emitting elements and the edge of the driving substrate is set to be less than half of the minimum distance between any two adjacent light-emitting elements, so that it is ensured that the brightness of the edge of the light-emitting panel is also relatively high, thereby avoiding the case where the brightness of the edge region of the light-emitting panel is low but the brightness of the middle region of the light-emitting panel is high. In this manner, the brightness difference of the entire light-emitting panel is reduced, and the light output uniformity of the light-emitting panel is ensured.

With continued reference to FIG. 1, the distance between two adjacent light-emitting elements 200 is the same.

In an embodiment, when the distance between each adjacent two light-emitting elements of the light-emitting elements 200 of the driving substrate 100 are set to be the same, the brightness difference of different regions in the light-emitting panel 10 may be effectively reduced, thereby improving the uniformity of the overall brightness of the light-emitting panel 10. For example, with reference to FIG. 1, the distance between two adjacent light-emitting elements 200 is L2. The specific value of this distance is not specifically limited in the embodiments of the present disclosure.

Figure 6:
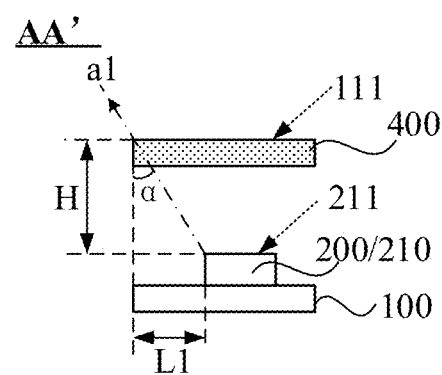
FIG. 6 is a sectional view taken along direction A-A' of FIG. 1.

FIG. 6 is a sectional view taken along direction A-A' of FIG. 1. With reference to FIGS. 1 and 6, each first light-emitting element 210 includes a light-emitting surface 211, and the light-emitting panel 10 includes a light output surface 111. In the thickness direction of the light-emitting panel 10, the distance between the light-emitting surface 211 and the light output surface 111 is H. The included angle between the maximum intensity light output direction of the first light-emitting element 210 and the thickness direction of the light-emitting panel 10 is α. The minimum distance L1 between the first light-emitting elements 210 and the edge of the driving substrate 100 satisfies $L1=\tan(\alpha)*H$.

The light-emitting element 200 has different maximum intensity light output viewing angles. For example, the maximum intensity light output viewing angle may be 30°, 45°, or 60°. The specific value is not limited in the embodiments of the present disclosure. In the light-emitting panel provided by the embodiments of the present disclosure, the distance between the first light-emitting element 210 and the edge of the driving substrate 100 may be adjusted according to the maximum intensity light output angle of the light-emitting element 200, so that the light output effect of the first light-emitting element 210 is ensured, and then the edge of the light-emitting panel 10 of the first light-emitting element 210 has a better light-emitting effect.

In an embodiment, with reference to FIG. 6, in the thickness direction of the light-emitting panel 10, the distance between the light-emitting surface 211 of the first light-emitting element 210 and the light output surface 111 of the light-emitting panel 10 is H, and the minimum distance between the first light-emitting elements 210 and the edge of the driving substrate 100 is L1. The light-emitting surface 211 refers to the light output side of a light-emitting element 200. The light output surface 111 refers to the surface on a side of an optical film 400 away from the driving substrate 100. In an embodiment, the optical film 400 includes a diffusion plate, a diffusion film, and a brightness enhancement film (not shown in the figure) and is configured to improve the light output effect of the light-emitting panel 10. At the same time, the included angle between the maximum intensity light output direction (light a1 in the figure) of the first light-emitting element 210 and the thickness direction of the light-emitting panel 10 is α. When the position where the first light-emitting element 210 is disposed satisfies the maximum intensity light output angle of the first light-emitting element 210, the value relationship of $L1=\tan(\alpha)*H$ is satisfied, that is, the distance between the first light-emitting element 210 and the edge of the driving substrate 100 is adjusted according to the maximum intensity light output angle of the light-emitting element 200. Thus, the overall light-emitting effect of the light-emitting panel 10 is ensured.

Figure 7:
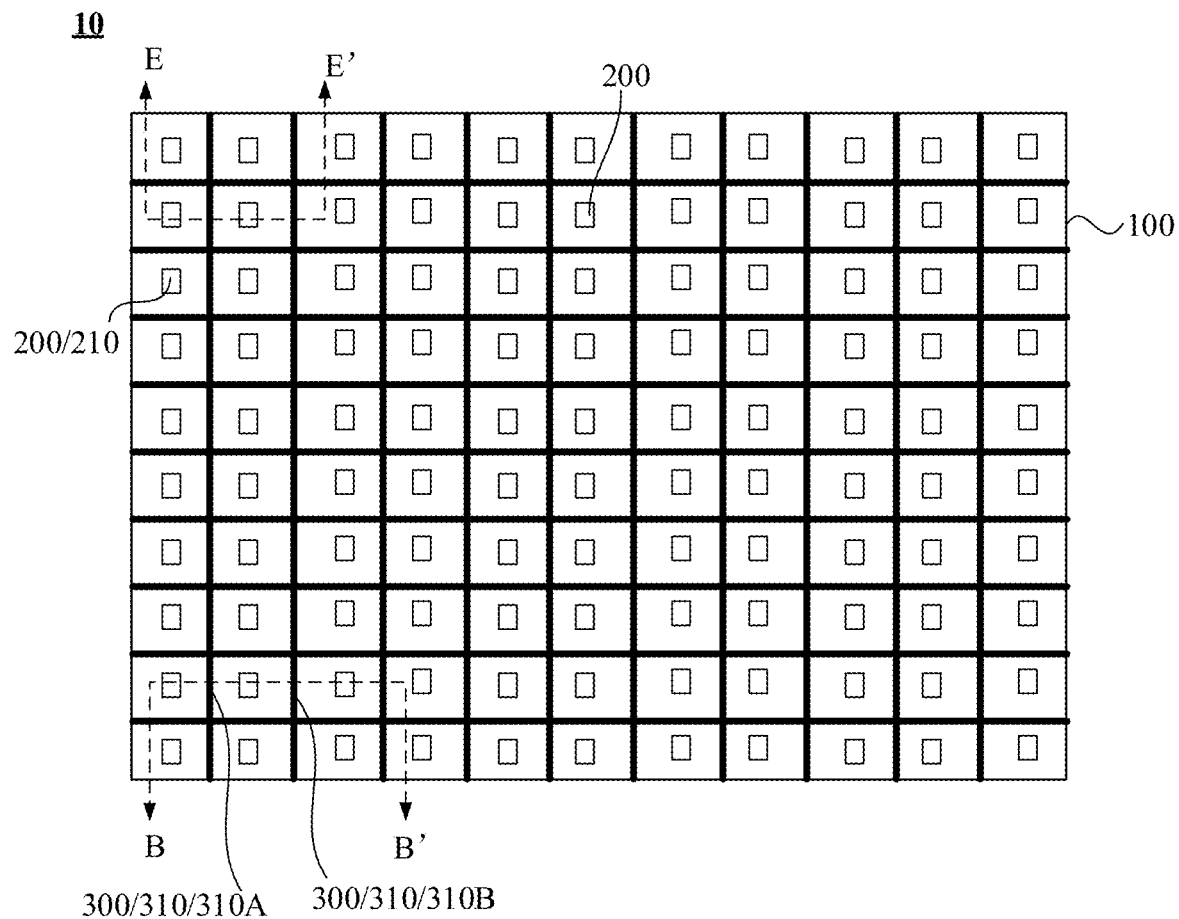
FIG. 7 is a diagram illustrating the structure of another light-emitting panel according to an embodiment of the present disclosure.
Figure 8:
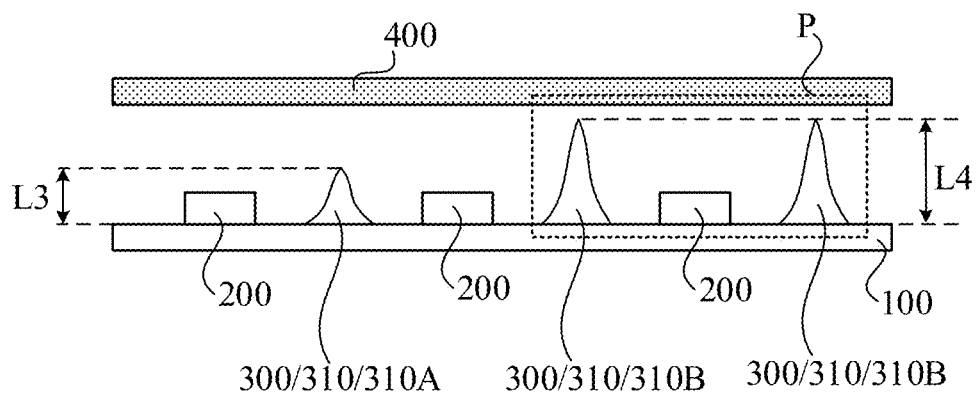
FIG. 8 is a sectional view taken along direction B-B' of FIG. 7.
Figure 9:
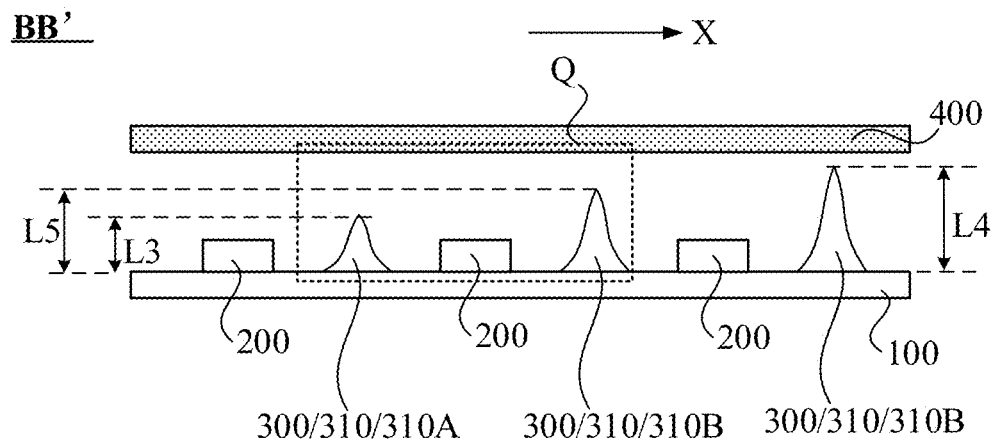
FIG. 9 is another sectional view taken along direction B-B' of FIG. 7.

FIG. 7 is a diagram illustrating the structure of another light-emitting panel according to an embodiment of the present disclosure. FIG. 8 is a sectional view taken along direction B-B' of FIG. 7. FIG. 9 is another sectional view taken along direction B-B' of FIG. 7. With reference to FIGS. 7 to 9, the light-emitting panel 10 also includes a reflection structure 300. The reflection structure 300 includes multiple reflector cups 310. The light-emitting elements 200 are disposed in defined regions of the reflector cups 310. The reflector cups 310 include first reflector cups 310A and second reflector cups 310B. The first reflector cups 310A are located on the side of the second reflector cups 310B close to the edge of the driving substrate 100. In the thickness direction of the light-emitting panel 10, the height of each first reflector cup 310A is less than the height of each second reflector cup 310B.

The light-emitting panel 10 also includes a reflection structure 300. The reflection structure 300 can reflect the light transmitted to the surface of the reflection structure 300, thereby adjusting the light emitted by the light-emitting panel 10 and ensuring the light-emitting effect of the light-emitting panel 10. In an embodiment, with reference to FIGS. 7 to 9, the reflection structure 300 includes reflector cups 310. The defined regions of the reflector cups 310 are configured to dispose the light-emitting elements 200, and each defined region may be disposed with one light-emitting element 200 or multiple light-emitting elements 200. Alternatively, no light-emitting element 200 is disposed in a small space region. This is not limited in the embodiments of the present disclosure. In another aspect, a reflector cup 310 may block the light crosstalk between two adjacent light-emitting elements 200, thereby improving the light output contrast of the light-emitting panel 10.

For example, the reflector cups 310 include first reflector cups 310A and second reflector cups 310B. With reference to FIGS. 7 to 9, the first reflector cups 310A are located on the side of the second reflector cups 310B close to the edge of the driving substrate 100, that is, the first reflector cups 310A are more close to the edge of the light-emitting panel 10 than the second reflector cups 310B. At the same time, in the thickness direction of the light-emitting panel 10, the height of each first reflector cup 310A is less than the height of each second reflector cup 310B. With reference to FIG. 8, L3 is less than L4. Alternatively, with reference to FIG. 9, L3 is less than L4. At the same time, L3 is less than L5. The height of the first reflector cup 310A close to the edge of the light-emitting panel 10 is adjusted and lowered. Thus, it is possible to ensure that light at the non-edge position of the driving substrate 100 or light of light-emitting elements 200 at the non-edge position of the light-emitting panel 10 is transmitted through a lower first reflector cup 310A to the region defined by the first reflector cup 310A, and the brightness at the edge of the driving substrate 100 or brightness at the edge of the light-emitting panel 10 is improved. In this manner, the brightness difference between the edge and the non-edge position of the light-emitting panel 10 is reduced, ensuring the light output uniformity of the light-emitting panel 10.

With continued reference to FIGS. 7 and 9, heights of multiple second reflector cups 310B increase in direction X from the edge of the light-emitting panel 10 to the center of the light-emitting panel 10.

In an embodiment, the heights of the multiple second reflector cups 310B increase, that is, the height of a second reflector cup 310B close to the edge of the light-emitting panel 10 or the edge of the driving substrate 100 is less than the height of a second reflector cup 310B far away from the edge of the light-emitting panel 10 or the edge of the driving substrate 100. For example, with reference to FIG. 9, the height of the second reflector cup 310B close to the edge is L5, the height of the second reflector cup 310B far away from the edge is L4, and L4 is greater than L5. That is, the light emitted in the defined region close to the edge is gradually increased. Thus, the uniformity of the overall light-emitting effect of the light-emitting panel 10 is ensured. For example, in direction X from the edge of the light-emitting panel 10 to the center of the light-emitting panel 10, the heights of the multiple second reflector cups 310B may gradually increase. Thus, the occurrence of a clear demarcation line of the brightness of the light-emitting panel 10 is avoided, thereby balancing the light-emitting effect of the light-emitting panel 10.

With continued reference to FIGS. 7 and 8, in direction X from the edge of the light-emitting panel 10 to the center of the light-emitting panel 10, the heights of the multiple second reflector cups 310B are the same.

With reference to FIG. 7, the height of the first reflector cup 310A is less than the height of the second reflector cup 310B. The brightness at the edge of the driving substrate 100 or brightness at the edge of the light-emitting panel 10 is improved. In this manner, the brightness difference between the edge and the non-edge position of the light-emitting panel 10 is reduced. In an embodiment, the second reflector cups 310B are set to have the same height, that is, the height of each of the second reflector cups 310B is L4. The heights of the multiple second reflector cups 310B are set to be the same, so that the preparation difficulty of the light-emitting panel 10 can be simplified, and the preparation cost of the light-emitting panel 10 can be reduced. The heights of the second reflector cups 310B are the same, that is, there is light transmission between the defined region of a second reflector cup 310B and the defined region of an adjacent reflector cup 310, that is, the second reflector cup 310B does not reach the position of the optical film 400. Alternatively, there may be no light transmission between the defined region of a second reflector cup 310B and the defined region of an adjacent reflector cup 310, that is, the second reflector cup 310B reaches the position of the optical film 400. Furthermore, it is ensured that the light-emitting effect is uniform at the position where a second reflector cup 310B is disposed in the light-emitting panel 10.

Figure 10:
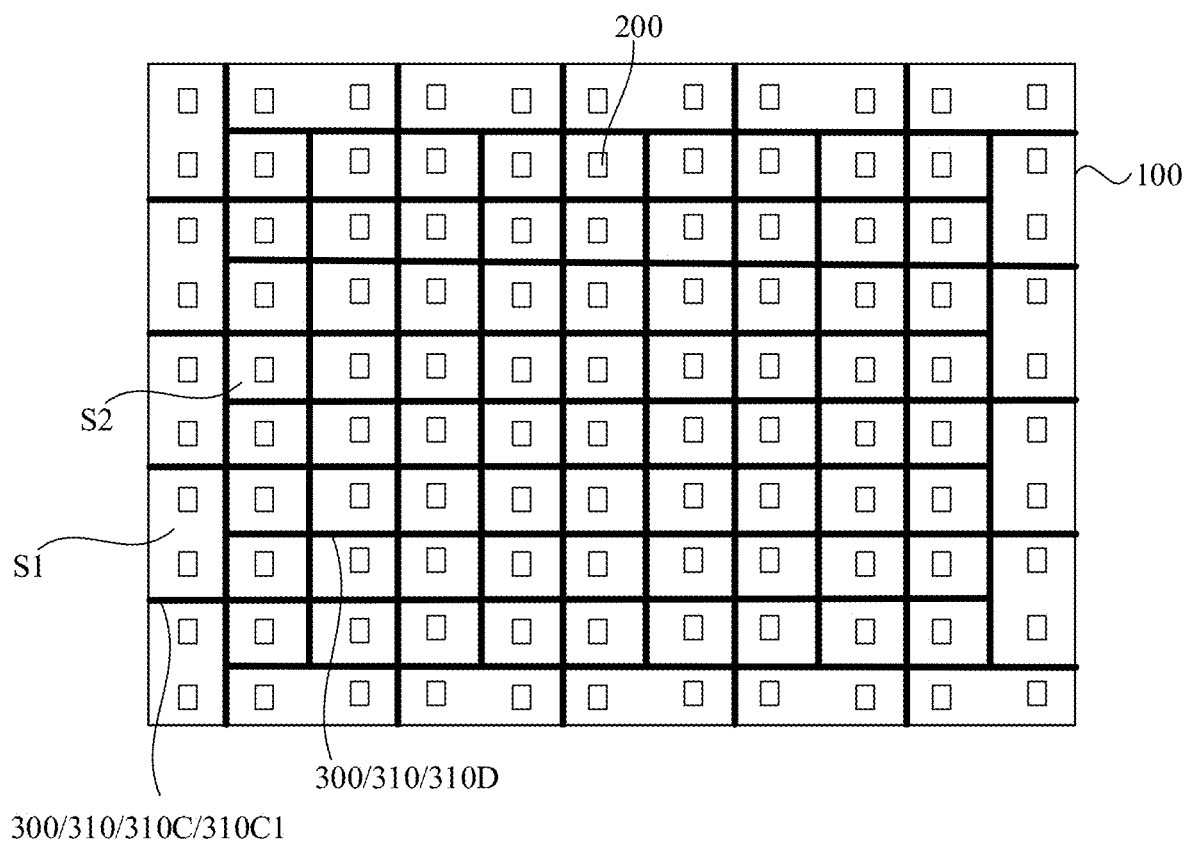
FIG. 10 is a diagram illustrating the structure of another light-emitting panel according to an embodiment of the present disclosure.
Figure 11:
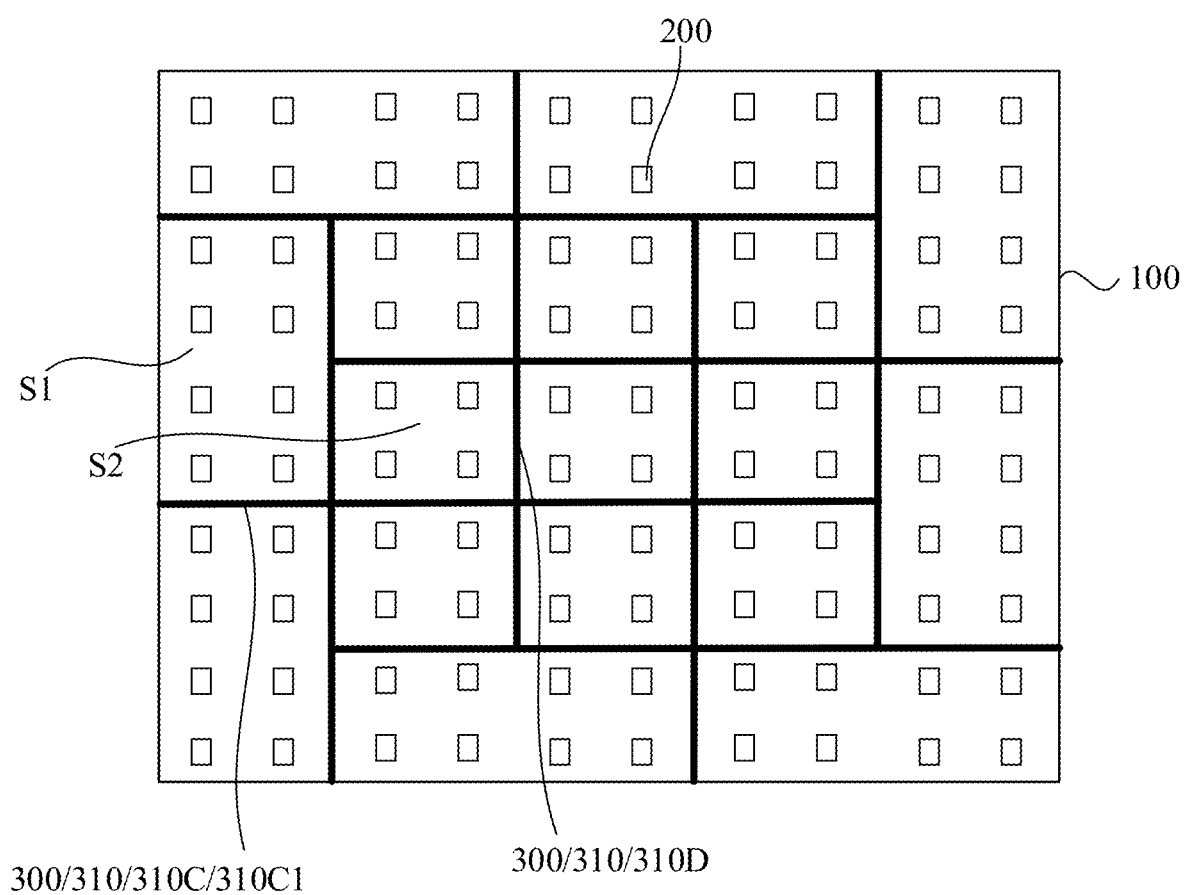
FIG. 11 is a diagram illustrating the structure of another light-emitting panel according to an embodiment of the present disclosure.
Figure 12:
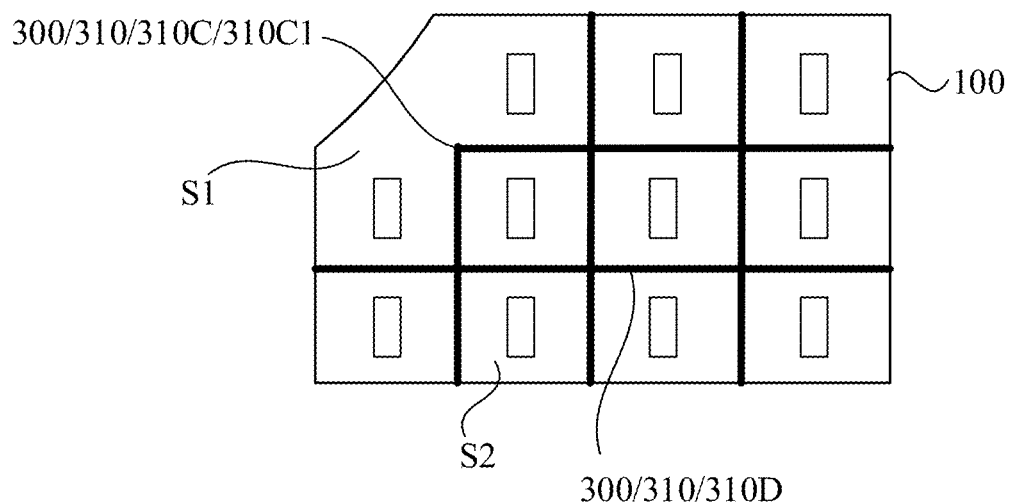
FIG. 12 is a diagram illustrating the structure of another light-emitting panel according to an embodiment of the present disclosure.

FIG. 10 is a diagram illustrating the structure of another light-emitting panel according to an embodiment of the present disclosure. FIG. 11 is a diagram illustrating the structure of another light-emitting panel according to an embodiment of the present disclosure. FIG. 12 is a diagram illustrating the structure of another light-emitting panel according to an embodiment of the present disclosure. With reference to FIGS. 10 to 12, the light-emitting panel 10 also includes a reflection structure 300. The reflection structure 300 includes multiple reflector cups 310. The light-emitting elements 200 are disposed in defined regions of the reflector cups 310. The reflector cups 310 include third reflector cups 310C and fourth reflector cups 310D. The third reflector cups 310C are located on the side of the fourth reflector cups 310D close to the edge of the driving substrate 100. The defined region of each of at least part of the third reflector cups 310C is greater than the defined region of each fourth reflector cup 310D.

In an embodiment, the light-emitting panel 10 also includes a reflection structure 300. The reflection structure 300 may reflect the light transmitted to the surface of the reflection structure 300, thereby adjusting the light emitted by the light-emitting panel 10 and ensuring the light-emitting effect of the light-emitting panel 10. With reference to FIGS. 10 to 12, the reflection structure 300 includes multiple reflector cups 310. The defined regions of the reflector cups 310 are configured to dispose the light-emitting elements 200, and each defined region may be disposed with one light-emitting element 200 or multiple light-emitting elements 200. The number of light-emitting elements 200 in a defined region is not specifically limited in the embodiments of the present disclosure. In an embodiment, the reflector cups 310 include third reflector cups 310C and fourth reflector cups 310D. A third reflector cup 310C and a fourth reflector cup 310D may refer to structures in which different light-emitting partitions are divided in the light-emitting panel 10 or may refer to structures in which multiple light-emitting elements 200 are divided in each light-emitting partition. This is not limited in the embodiments of the present disclosure. Light-emitting partitions may refer to light-emitting regions, in the light-emitting panel 10, formed according to different brightness, different light-emitting effects, or different light-emitting element groups. This is not limited in the embodiments of the present disclosure.

For example, a third reflector cup 310C is located on the side of a fourth reflector cup 310D close to the edge of the driving substrate 100, that is, the position of the third reflector cup 310C is more close to the edge of the light-emitting panel 10 or the edge of the driving substrate 100. To ensure that the edge of the light-emitting panel 10 or the edge of the driving substrate 100 may have similar or the same brightness or light-emitting effect as the center of the light-emitting panel 10 or the center of the driving substrate 100, the defined region of one of at least part of the third reflector cups 310C is greater than the defined region of one of the fourth reflector cups 310D. For example, the defined region of the third reflector cup 310C is relatively great. The regions of reflector cups 310 close to the edge of the light-emitting panel or the edge of the driving substrate 100 may be fused, so that the defined region of the third reflector cup 310C becomes greater. Thus, it is possible to ensure that a region having a poor light-emitting effect is fused with the defined region of a peripheral reflector cup 310, so that the light emitted by a light-emitting element 200 can reach an original region having a poor light-emitting effect, thereby ensuring the overall light-emitting effect of the light-emitting panel 10.

For example, with reference to FIGS. 10 and 11, the defined region of the third reflector cup 310C is greater than the defined region of the fourth reflector cup 310D. The defined region of the third reflector cup 310C is a fusion of the defined region of a reflector cup 310 at the edge of the light-emitting panel 10 or the edge of driving substrate 100 and the defined region of an adjacent reflector cup 310, so that the light-emitting effect of an edge region is improved. In this manner, the difference between the light-emitting effect of the edge of the light-emitting panel 10 and the light-emitting effect of the central region of the light-emitting panel 10 is weakened, and the overall light-emitting effect of the light-emitting panel 10 is ensured. A description is given with reference to FIGS. 10 and 11 by using an example in which the defined regions of reflector cups 310 in the light-emitting panel 10 include different numbers of light-emitting elements 200.

With continued reference to FIGS. 10 to 12, the third reflector cups 310C include first reflector sub-cups 310C1. The area of the defined region of each first reflector sub-cup 310C1 is s1, and the area of the defined region of one of other reflector cups 310 is S2, where S1/S2≥1.5. The number of light-emitting elements 200 in the defined region of the first reflector sub-cup 310C1 is greater than the number of light-emitting elements in the defined region of the fourth reflector cup 310D.

For example, with reference to FIGS. 10 to 12, the third reflector cups 310C include first reflector sub-cups 310C1. The area of the defined region of each first reflector sub-cup 310C1 is S1, that is, the area of the defined region of the first reflector sub-cup 310C1 formed by the fusion of the defined regions of reflector cups 310 close to the edge of the light-emitting panel 10 or the edge of the driving substrate 100 is S1. Compared with the case that the defined region of one of other reflector cups 310 is S2, for example, the area of the defined region of a fourth reflector cup 310D is S2. The defined region of the first reflector sub-cup 310C1 is greater than the defined region of the fourth reflector cup 310D, that is, S1>S2.

For example, the area of the defined region of the first reflector sub-cup 310C1 is S1, the defined region of one of other reflector cups 310 is S2. For example, the area of the defined region of the fourth reflector cup 310D is S2. When S 1/S2≥1.5, that is, the area of the defined region of the first reflector sub-cup 310C1 is relatively great, the number of light-emitting elements 200 in the first reflector sub-cup 310C1 may be increased. In this manner, it is avoided that there are not enough light-emitting elements 200 to provide sufficient brightness due to the great defined region in the first reflector sub-cup 310C1. In an embodiment, with reference to FIGS. 10 to 12, the number of light-emitting elements 200 in the defined region of the first reflector sub-cup 310C1 is greater than the number of light-emitting elements in the defined region of the fourth reflector cup 310D. The specific number of light-emitting elements 200 is not limited in the embodiments of the present disclosure. It is ensured that the defined region of the first reflector sub-cup 310C1 is relatively great, and at the same time, the number of light-emitting elements 200 in the defined region of the first reflector sub-cup 310C1 are increased, that is, the brightness of the first reflector sub-cup 310C1 is increased, and then the brightness of the third reflector cup 310C is increased. In this manner, it is ensured that the difference between the brightness of the third reflector cup 310C and the brightness of the fourth reflector cup 310D is small. Further, the brightness difference between different regions of the entire light-emitting panel 10 is weakened, so that the overall light-emitting effect of the light-emitting panel 10 is ensured.

With continued reference to FIGS. 10 to 12, multiple light-emitting elements 200 are uniformly disposed in the defined region of each first reflector sub-cup 310C1.

The defined region of the first reflector sub-cup 310C1 is relatively great. To further ensure that the brightness of the defined region of the first reflector sub-cup 310C1 is similar to the brightness of the defined region of one of the other reflector cups 310 such as the fourth reflector cup 310D, the number of light-emitting elements 200 may be increased in the defined region of the first reflector sub-cup 310C1. In an embodiment, to ensure the light-emitting effect in the defined region of the first reflector sub-cup 310C1, multiple light-emitting elements 200 are uniformly disposed, that is, the number of light-emitting elements 200 in the defined region of the first reflector sub-cup 310C1 may be increased, and at the same time, the disposition positions of original light-emitting elements 200 are adjusted and merged, so that the entire light-emitting elements 200 are distributed evenly. That is, in the defined region of the first reflector sub-cup 310C1, the distance between each two adjacent light-emitting elements 200 of multiple light-emitting elements 200 is the same, or the number of light-emitting elements 200 in the defined region of the first reflector sub-cup 310C1 is the same. Light-emitting elements 200 are uniformly disposed, so that it is also possible to ensure the uniformity of the light-emitting effect. In one aspect, it is possible to ensure that the first reflector sub-cup 310C1 has enough space to place a newly increased light-emitting element 200. In the other aspect, it is possible to ensure that the uniformity of the light-emitting effect of a merged reflector cup 310 is good, and the overall light-emitting effect of the light-emitting panel 10 is ensured.

Figure 13:
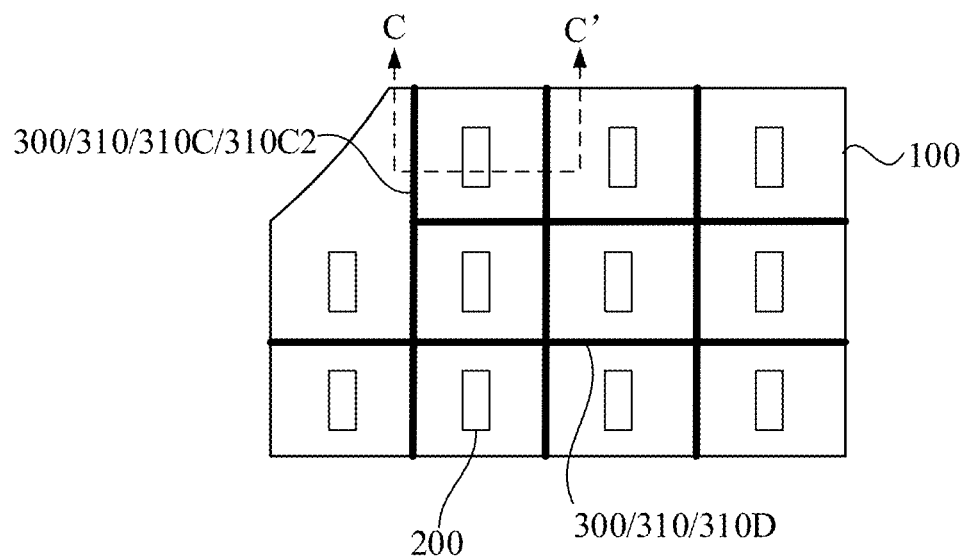
FIG. 13 is a diagram illustrating the structure of another light-emitting panel according to an embodiment of the present disclosure.

FIG. 13 is a diagram illustrating the structure of another light-emitting panel according to an embodiment of the present disclosure. With reference to FIG. 13, the third reflector cups 310C include at least one second reflector sub-cup 310C2. The defined region of each second reflector sub-cup 310C2 is greater than the defined region of one of other reflector cups 310. The number of light-emitting elements 200 in the defined region of the second reflector sub-cup 310C2 is equal to the number of light-emitting elements 200 in the defined region of the fourth reflector cup 310D.

In an embodiment, the third reflector cup 310C is located on the side of the fourth reflector cup 310D close to the edge of the driving substrate 100, that is, the position of the third reflector cup 310C is more close to the edge of the light-emitting panel 10 or the edge of the driving substrate 100. To ensure that the edge of the light-emitting panel 10 or the edge of the driving substrate 100 may have similar or the same brightness or light-emitting effect as the center of the light-emitting panel 10 or the center of the driving substrate 100, the defined region of the second reflector sub-cup 310C2 is greater than the defined region of the fourth reflector cup 310D. For example, with reference to FIG. 13, in the light-emitting panel 10, part of the edge regions where light-emitting elements 200 cannot be disposed or part of the regions where the light transmission effect of a light-emitting element 200 is relatively poor are merged with the defined region of adjacent reflector cups 310. A merged region is the defined region of the second reflector sub-cup 310C2, that is, the defined region of the second reflector sub-cup 310C2 is greater than the defined region of the other reflector cups 310 such as the fourth reflector cup 310D. Further, the number of light-emitting elements 200 in the defined region of the second reflector sub-cup 310C2 is equal to the number of light-emitting elements 200 in the defined region of the fourth reflector cup 310D, that is, no new light-emitting element 200 is increased to the defined region of the merged second reflector sub-cup 310C2. That is, it is ensured that the number of light-emitting elements 200 in the defined region of each reflector cup 310 in the light-emitting panel 10 is the same, and that the light-emitting panel 10 is more regular as a whole. It is to be noted that no new light-emitting element 200 is increased to the second reflector sub-cup 310C2, that is, the region of the merged second reflector sub-cup 310C2 is not provided with enough space to add a new light-emitting element 200. For example, the area of the defined region of the merged second reflector sub-cup 310C2 is S3, and the area of the defined region of one of other reflector cups 310 is S2, where S3/S2<1.5. At the same time, the second reflector sub-cup 310C2 is a defined region after merging. The regions having weak or poor light-emitting effect can improve the brightness by the light provided by a merged light-emitting element 200, that is, regions having no or little light transmission in an edge region are broken through and converted into regions having light transmission. That is, the light-emitting effect of the edge region of the light-emitting panel 10 is ensured.

Figure 14:
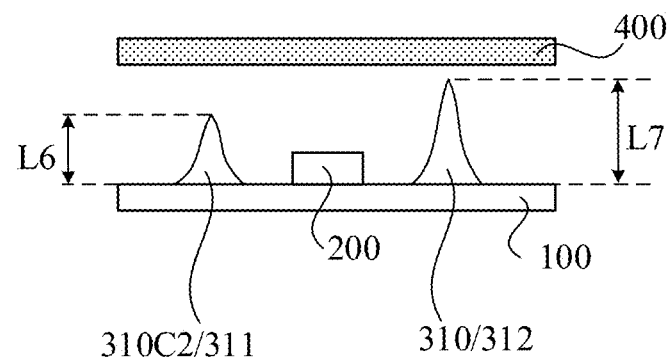
FIG. 14 is another sectional view taken along direction C-C' of FIG. 13.

FIG. 14 is another sectional view taken along direction C-C' of FIG. 13. With continued reference to FIGS. 13 and 14, the reflector cups 310 include reflector cup walls 312. The second reflector sub-cup 310C2 includes a first reflector cup wall 311 close to side of other reflector cups 310. The height of at least part of the first reflector cup wall 311 is less than the height of other reflector cup walls 312.

In an embodiment, the reflector cups 310 include reflector cup walls 312, that is, the light emitted by the light-emitting element 200 in the defined region of a reflector cup 310 may be reflected and transmitted through a reflector cup wall 312, so that the light of the light-emitting element 200 in the light-emitting panel 10 is adjusted, thereby implementing the light-emitting effect of the light-emitting panel 10. With reference to FIG. 14, the second reflector sub-cup 310C2 includes a first reflector cup wall 311. The first reflector cup wall 311 in a second reflector sub-cup 310C2 is close to the reflector cup wall 312 on the side of one of other reflector cups 310. The height of the first reflector cup wall 311 and the height of one of other reflector cup walls 312 are adjusted. In this manner, the light in the defined regions of other reflector cups 310 may be transmitted to the second reflector sub-cup 310C2 through the first reflector cup wall 311 having a lower height, and the brightness of the defined region of a second reflector sub-cup 310C2 is improved. In other words, in the case where the number of light-emitting elements 200 is not increased in the defined region of a merged second reflector sub-cup 310C2, the height of the first reflector cup wall 311 is adjusted to be less than the height of other reflector cup walls 312, so that it is ensured that the light-emitting light in other reflector cups 310 may be transmitted to the second reflector sub-cup 310C2, that is, to the third reflector cups 310C. In this manner, the overall brightness of the light-emitting panel 10 is ensured, and the light-emitting effect of the light-emitting panel 10 is ensured.

Figure 15:
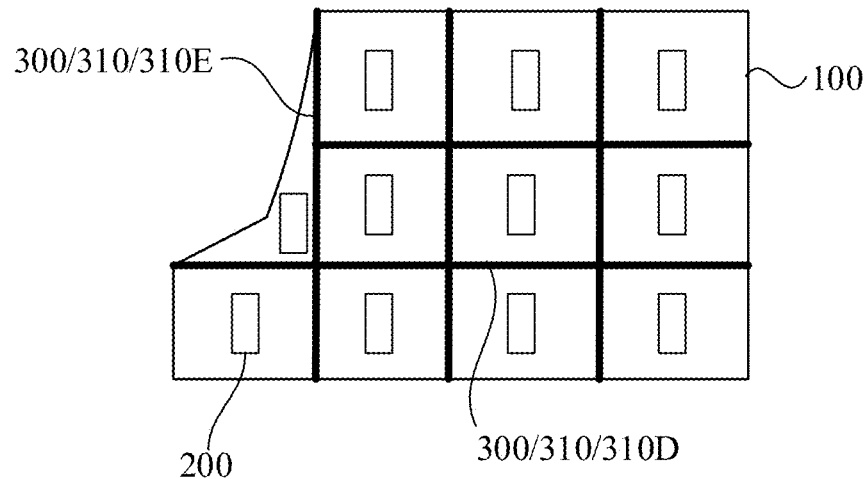
FIG. 15 is a diagram illustrating the structure of another light-emitting panel according to an embodiment of the present disclosure.

FIG. 15 is a diagram illustrating the structure of another light-emitting panel according to an embodiment of the present disclosure. With continued reference to FIG. 15, the light-emitting panel 10 also includes a reflection structure 300. The reflection structure 300 includes multiple reflector cups 310. The light-emitting elements 200 are disposed in defined regions of the reflector cups 310. The reflector cups 310 include fourth reflector cups 310D and at least one fifth reflector cup 310E. Each fifth reflector cup 310E is located on the side of the fourth reflector cup 310D close to the edge of the driving substrate 100. The defined region of the fifth reflector cup 310E is less than the definition region of the fourth reflector cup 310D and is greater than the disposition region of a light-emitting element 200. The fifth reflector cup 310E is provided with the light-emitting element 200 disposed in the central region.

In an embodiment, the fifth reflector cup 310E is located on the side of the fourth reflector cup 310D close to the edge of the driving substrate 100, that is, the position of the fifth reflector cup 310E is more close to the edge of the light-emitting panel 10 or the edge of the driving substrate 100. To ensure that the edge of the light-emitting panel 10 or the edge of the driving substrate 100 may have similar or the same brightness or light-emitting effect as the center of the light-emitting panel 10 or the center of the driving substrate 100, that is, the disposition position of a light-emitting element 200 in the defined region of the fifth reflector cup 310E is adjusted to ensure that the light-emitting condition in the fifth reflector cups 310E is similar to or the same as the light-emitting condition of other reflector cups 310 and to avoid a significant difference in the light-emitting effects of different regions of the light-emitting panel 10.

For example, with reference to FIG. 15, the defined region of the fifth reflector cup 310E is less than the defined region of the fourth reflector cup 310D. However, in the case where a light-emitting element 200 may still be disposed in the defined region of the fifth reflector cup 310E, the light-emitting element 200 is disposed at the center of the defined region of the fifth reflector cup 310E. Thus, it is ensured that the light emitted by the light-emitting element 200 is uniform in the defined region of the fifth reflector cup 310E, that is, the position of the light-emitting element 200 in the defined region of the reflector cup 310 close to the edge region is adjusted. In this manner, the light shape of the light-emitting panel 10 is improved, and the overall light-emitting effect of the light-emitting panel 10 is ensured. In other words, the area of the defined region of the fifth reflector cup 310E is less than the area of a complete partition, that is, the area of the defined region of the fourth reflector cup 310D. However, the defined region of the fifth reflector cup 310E is still enough to arrange a light-emitting element 200. In this manner, the position of the light-emitting element 200 is adjusted, so that the light-emitting element 200 is located at the center of the partition region as far as possible to improve the light shape.

Figure 16:
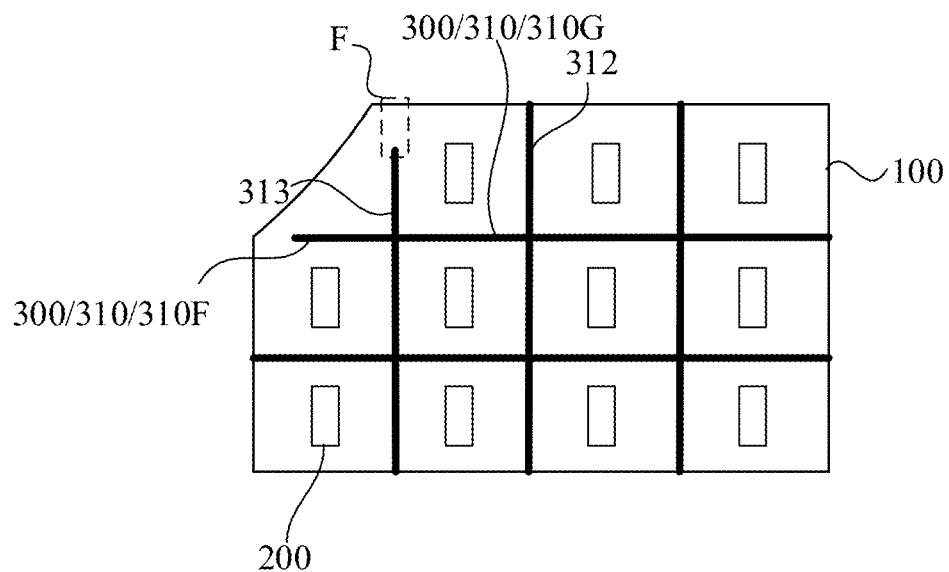
FIG. 16 is a diagram illustrating the structure of another light-emitting panel according to an embodiment of the present disclosure.
Figure 17:
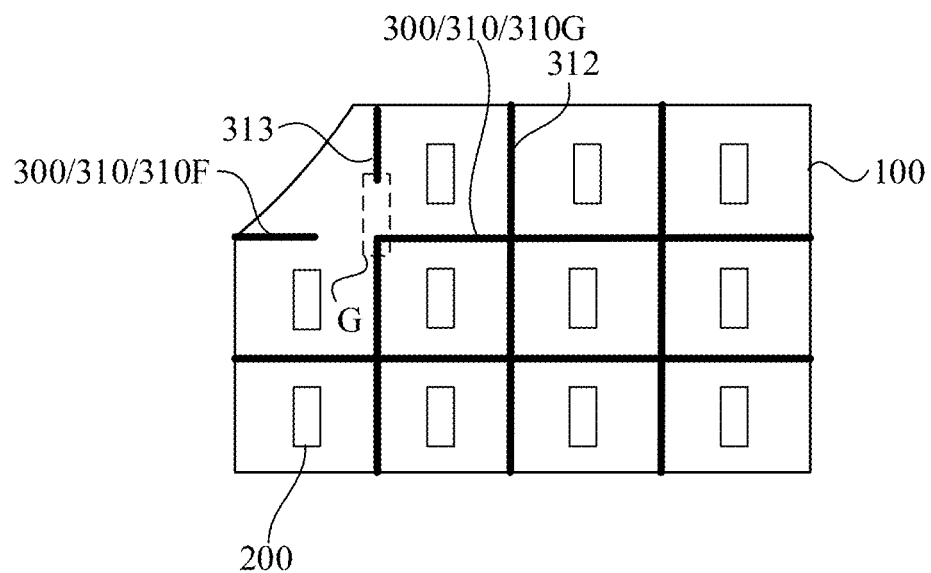
FIG. 17 is a diagram illustrating the structure of another light-emitting panel according to an embodiment of the present disclosure.

FIG. 16 is a diagram illustrating the structure of another light-emitting panel according to an embodiment of the present disclosure. FIG. 17 is a diagram illustrating the structure of another light-emitting panel according to an embodiment of the present disclosure. With reference to FIGS. 16 and 17, the light-emitting panel 10 also includes a reflection structure 300. The reflection structure 300 includes multiple reflector cups 310. The light-emitting elements 200 are disposed in defined regions of the reflector cups 310. The reflector cups 310 include at least one sixth reflector cup 310F and seventh reflector cups 310G. Each sixth reflector cup 310F is located on the side of a seventh reflector cup 310G close to the edge of the driving substrate 100. A second reflector cup wall 313 is shared between the sixth reflector cup 310F and another reflector cup 310 adjacent to the sixth reflector cup 310F. A gap exists between the second reflector cup wall 313 and the edge of the driving substrate 100. Alternatively, a gap exists between the second reflector cup wall 313 and the reflector cup wall 312 of one of other reflector cups 310.

In an embodiment, with reference to FIGS. 16 and 17, the reflector cups 310 may include at least one sixth reflector cups 310F and seventh reflector cups 310G. Each sixth reflector cup 310F is located on the side of the seventh reflector cup 310G close to the edge of the driving substrate 100. That is, the defined region of the sixth reflector cup 310F is the defined region of the reflector cup 310 close to the edge of light-emitting panel 10. To ensure the brightness of the defined region of the sixth reflector cup 310F, the position and size of the second reflector cup wall 313 shared between the sixth reflector cups 310F and another reflector cup 310 adjacent to the sixth reflector cups 310F may be adjusted. In this manner, the light provided by a light-emitting element 200 of the defined regions of the another reflector cup 310 adjacent to the sixth reflector cup 310F may also be used to improve the brightness of the defined region of the sixth reflector cup 310F.

In an embodiment, with reference to FIG. 16, the gap exists between the second reflector cup wall 313 and the edge of the driving substrate 100, that is, the gap shown in region F in FIG. 16. With reference to FIG. 17, the gap exists between the second reflector cup wall 313 and the reflector cup wall 312 of one of other reflector cups 310, that is, the gap shown in region Gin FIG. 17. In other words, a shared reflector cup wall 312 is disposed, that is, the gap exists between the second reflector cup wall 313 and the edge of the driving substrate 100 or between the second reflector cup wall 313 and the reflector cup wall 312 of one of other reflector cups 310. Through this gap, the light-emitting elements 200 in another reflector cup 310 may supplement the defined region of the sixth reflector cup 310F with light, so that the edge brightness of the display panel 10 is improved. In this manner, the brightness difference between the edge region of the light-emitting panel 10 and other regions is reduced, and the uniformity of the light output by the light-emitting panel 10 is improved.

Figure 18:
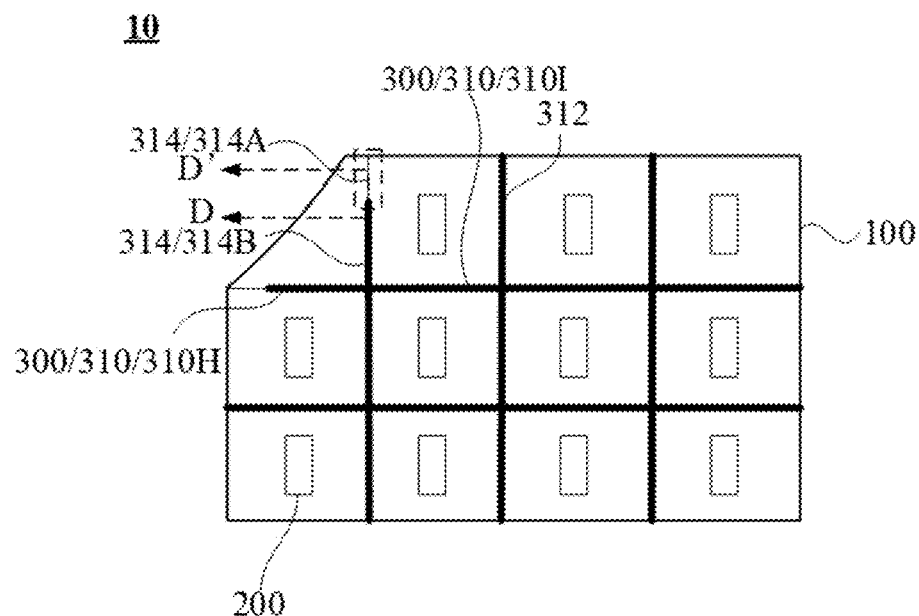
FIG. 18 is a diagram illustrating the structure of another light-emitting panel according to an embodiment of the present disclosure.
Figure 19:
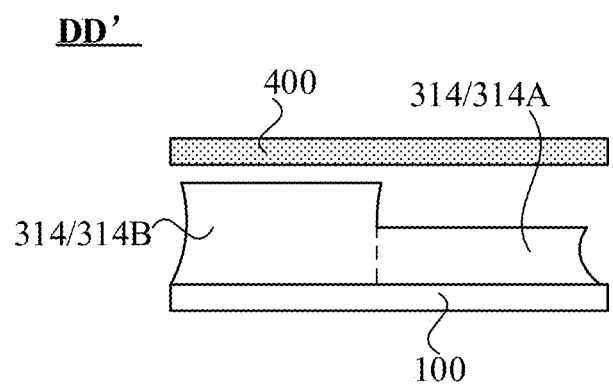
FIG. 19 is another sectional view taken along direction D-D' of FIG. 18.

FIG. 18 is a diagram illustrating the structure of another light-emitting panel according to an embodiment of the present disclosure. FIG. 19 is another sectional view taken along direction D-D' of FIG. 18. With reference to FIGS. 18 and 19, the light-emitting panel 10 also includes a reflection structure 300. The reflection structure 300 includes multiple reflector cups 310. The light-emitting elements 200 are disposed in defined regions of the reflector cups 310. The reflector cups 310 include at least one eighth reflector cup 310H and ninth reflector cups 310I. Each eighth reflector cup 310H is located on the side of the ninth reflector cup 310I close to the edge of the driving substrate 100. Third reflector cup wall 314 is shared between the eighth reflector cup 310H and another reflector cup 310 adjacent to the eighth reflector cup 310H. The third reflector cup wall 314 includes a first cup wall section 314A and a second cup wall section 314B connected to each other. In the thickness direction of the light-emitting panel the height of the first cup wall section 314A is less than the height of the second cup wall section 314B.

In an embodiment, with reference to FIGS. 18 and 19, the reflector cups 310 may include at least one eighth reflector cup 310H and ninth reflector cups 310I. Each eighth reflector cup 310H is located on the side of the ninth reflector cup 310I close to the edge of the driving substrate 100. That is, the defined region of the eighth reflector cup 310H is the defined region of the reflector cup 310 close to the edge of light-emitting panel 10. To ensure the brightness of the defined region of the eighth reflector cup 310H, the height of the third reflector cup wall 314 shared between the eighth reflector cup 310H and another reflector cup 310 adjacent to the eighth reflector cup 310H may be adjusted. In this manner, the light provided by a light-emitting element 200 of the defined region of another reflector cup 310 adjacent to the eighth reflector cup 310H may also be used to improve the brightness of the defined region of the eighth reflector cup 310H.

In an embodiment, with reference to FIGS. 18 and 19, each eighth reflector cup 310H include a third reflector cup wall 314. The third reflector cup wall 314 is a reflection wall shared between the eighth reflector cup 310H and another reflector cup 310 adjacent to the eighth reflector cup 310H. For example, the third reflector cup wall 314 includes a first cup wall section 314A and a second cup wall section 314B connected to each other. The height of the first cup wall section 314A and the height of the second cup wall section 314B are different. The height of the first cup wall section 314A is less than the height of the second cup wall section 314B. That is, the two are connected to each other, and the heights are staggered from each other. Further, light emitted by the light-emitting element 200 in the defined region of the adjacent reflector cup 310 may be transmitted to the defined region of the eighth reflector cup 310H, and the brightness of the defined region of the eighth reflector cup 310H located at the edge may be improved. In other words, a shared reflector cup wall 312, that is, the third reflector cup wall 314, is configured to have two sections having different heights, that is, the first cup wall section 314A and the second cup wall section 314B. Through the lower first cup wall section 314A, the light-emitting elements 200 in other reflector cups 310 may supplement light to the defined region of the eighth reflector cup 310H, so that the edge brightness of the display panel 10 is improved. In this manner, the brightness difference between the edge region of the light-emitting panel 10 and other regions is reduced, and the light output uniformity is improved.

Figure 20:
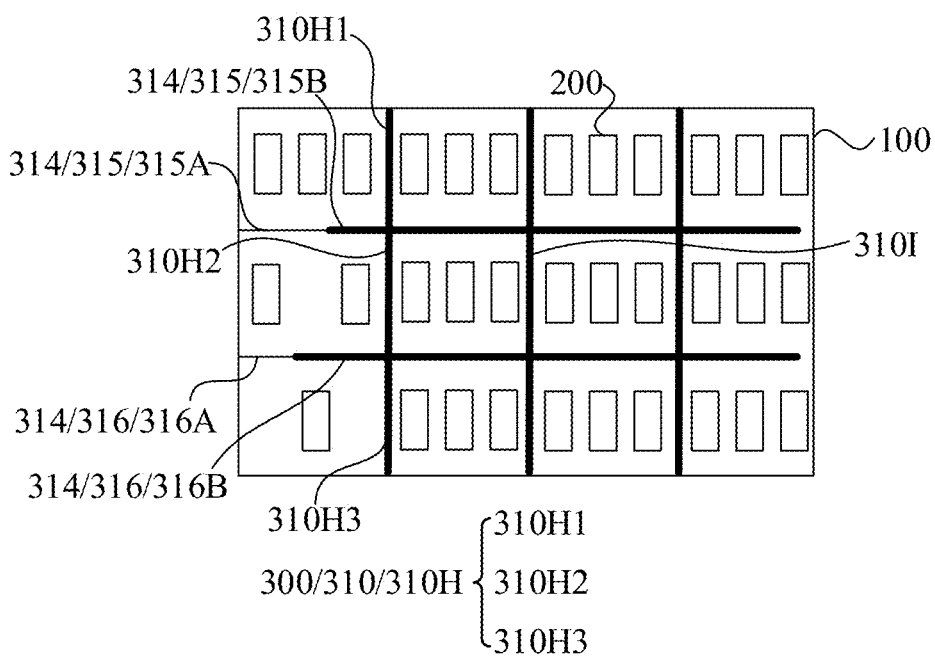
FIG. 20 is a diagram illustrating the structure of another light-emitting panel according to an embodiment of the present disclosure.

FIG. 20 is a diagram illustrating the structure of another light-emitting panel according to an embodiment of the present disclosure. With reference to FIG. 20, each eighth reflector cup 310H include a third reflector sub-cup 310H1, a fourth reflector sub-cup 310H2, and a fifth reflector sub-cup 310H3. A third reflector cup wall 314 includes a first reflector cup sub-wall 315 and a second reflector cup sub-wall 316. The third reflector sub-cup 310H1 and the fourth reflector sub-cup 310H2 share the first reflector cup sub-wall 315. The fourth reflector sub-cup 310H2 and the fifth reflector sub-cup 310H3 share the second reflector cup sub-wall 316. The distribution density of light-emitting elements 200 in the defined region of the third reflector sub-cup 310H1 is greater than the distribution density of light-emitting elements 200 in the defined region of the fifth reflector sub-cup 310H3. In the first reflector cup sub-wall 315, the ratio of the length of a first cup wall section 315A to the length of a second cup wall section 315B is a; and in the second reflector cup sub-wall 316, the ratio of the length of a first cup wall section 316A to the length of a second cup wall section 316B is b, where a>b.

In an embodiment, with reference to FIG. 20, the eighth reflector cup 310H include the third reflector sub-cup 310H1, the fourth reflector sub-cup 310H2, and the fifth reflector sub-cup 310H3. The distribution density of light-emitting elements 200 in the defined region of the third reflector sub-cup 310H1, the distribution density of light-emitting elements 200 in the defined region of the fourth reflector sub-cup 310H2, and the distribution density of light-emitting elements 200 in the defined region of the fifth reflector sub-cup 310H3 are different. That is, the distribution density of the light-emitting elements 200 in the defined regions of multiple reflector cups 310 located at the edge of the light-emitting panel 10 or the edge of the driving substrate 100 are different. That is, the light-emitting effects of the light-emitting elements 200 in the different reflector cups 310 located at an edge are different. The section condition of the third reflector cup wall 314 may be adjusted, so that finer control at different light emission degrees is implemented, thereby ensuring the light-emitting uniformity of the light-emitting panel 10.

In an embodiment, with reference to FIG. 20, a third reflector cup wall 314 includes a first reflector cup sub-wall 315 and a second reflector cup sub-wall 316. A third reflector sub-cup 310H1 and a fourth reflector sub-cup 310H2 share the first reflector cup sub-wall 315. A fourth reflector sub-cup 310H2 and a fifth reflector sub-cup 310H3 share the second reflector cup sub-wall 316. Each of the first reflector cup sub-wall 315 and the second reflector cup sub-wall 316 may include sections connected to each other and having different heights. In an embodiment, with reference to FIG. 20, the first reflector cup sub-wall 315 includes a first cup wall section 315A and a second cup wall section 315B. The height of the first cup wall section 315A is less than the height of the second cup wall section 315B. At the same time, the ratio of the length of the first cup wall section 315A to the length of the second cup wall section 316B is a; and the second reflector cup sub-wall 316 includes a first cup wall section 316A and a second cup wall section 316B, the height of the first cup wall section 316A is less than the height of the second cup wall section 316B, and at the same time, the ratio of the length of the first cup wall section 316A to the length of the second cup wall section 316B is b, further, where a>b. That is, in the reflector cup 310 where the distribution density of light-emitting elements 200 is relatively great, that is, the third reflector sub-cup 310H1, the disposition proportion of the first cup wall section 315A may be greater. The light emitted by the light-emitting elements 200 may be more emitted through the first cup wall section 315A. In the reflector cup 310 where the distribution density of light-emitting elements 200s is relatively small, that is, the fifth reflector sub-cup 310H3, the disposition proportion of the first cup wall section 316A may be less. The light emitted by the light-emitting elements 200 may be less emitted through the first cup wall section 316A. The light emission conditions of the reflector cup 310 having different distribution density of the light-emitting elements 200 are summarized, thereby ensuring the overall light-emitting uniformity of the light-emitting panel 10.

For example, with continued reference to FIG. 20, the first cup wall section 315A or 316A is located on the side of the second cup wall section 315B or 316B close to the edge of the driving substrate 100.

In an embodiment, description is given by using an example in which the third reflector sub-cup 310H1 and the fourth reflector sub-cup 310H2 share the first reflector cup sub-wall 315. The first cup wall section 315A is located on the side of the second cup wall section 315B close to the edge of the driving substrate 100. In this manner, the light supplement effect at the edge position may be increased, and the light output uniformity of the edge position and other positions may be improved. Similarly, description is given by using an example in which the fourth reflector sub-cup 310H2 and the fifth reflector sub-cup 310H3 share the second reflector cup sub-wall 316. The first cup wall section 316A is located on the side of the second cup wall section 316B close to the edge of the driving substrate 100. In this manner, the light supplement effect at the edge position can be increased, and the light output uniformity of the edge position and other positions can be improved.

Figure 21:
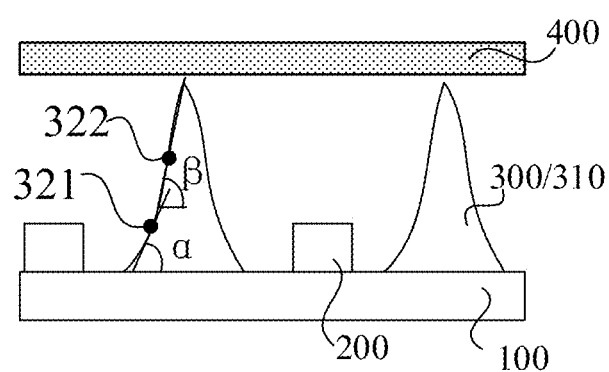
FIG. 21 is a sectional view taken along direction E-E' of FIG. 7.

FIG. 21 is a sectional view taken along direction E-E' of FIG. 7. With reference to FIG. 21, the light-emitting panel 10 also includes a reflection structure 300. The reflection structure 300 includes multiple reflector cups 310. The light-emitting elements 200 are disposed in defined regions of the reflector cups 310. At least one reflector cup 310 includes a reflective curved surface 320 on the side of the reflector cup 310 close to a light-emitting element 200. The reflective curved surface 320 includes a first reflection position 321 and a second reflection position 322. The first reflector cup 321 is located on the side of the second reflector cup 322 close to the driving substrate 100. The first reflection position 321 is located on the side of the second reflection position 322 close to the light-emitting element 200. The included angle between the tangent at the first reflection position 321 and the plane where the driving substrate 100 is located is α, and the included angle between the tangent at the second reflection position 322 and the plane where the driving substrate 100 is located is β, where 0°<α<β≤90°.

In an embodiment, the reflective curved surface 320 includes a first reflection position 321 and a second reflection position 322. The first reflection position 321 is more close to the driving substrate 100 and more close to the light-emitting elements 200 than the second reflection position 322. For example, included angle β between the tangent at the first reflection position 321 and the plane where the driving substrate 100 is located and included angle γ between the tangent at the second reflection position 322 and the plane where the driving substrate 100 is located satisfy 0°<β<γ≤90°. That is, the reflector cup 310 shown in FIG. 21 is formed. The solution in the embodiments of the present disclosure can make more light emitted by the light-emitting elements 200 emit from the vicinity of the reflector cups 310. In this manner, the amount of light emitted near the reflection structure 300 is increased, and the amount of light emitted directly above the light-emitting elements 200 is reduced. Thus, the light output uniformity is further improved, and the problem of poor light output uniformity of the light-emitting panel 10 is alleviated.

Figure 22:
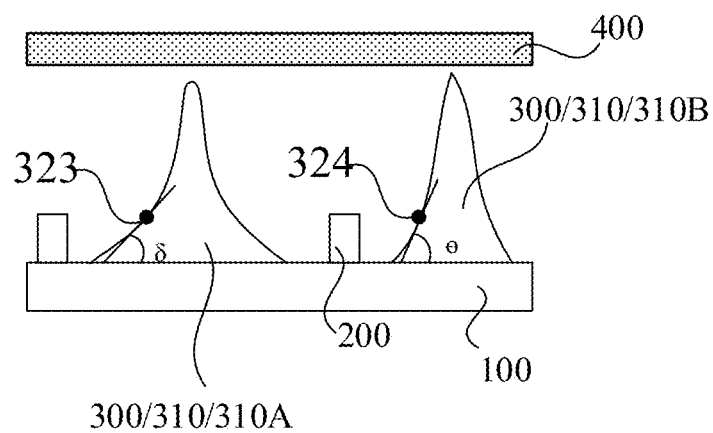
FIG. 22 is another sectional view taken along direction E-E' of FIG. 7.

FIG. 22 is another sectional view taken along direction E-E' of FIG. 7. With reference to FIG. 22, the reflector cups 310 include first reflector cups 310A and second reflector cups 310B. The first reflector cups 310A are located on the side of the second reflector cups 310B close to the edge of the driving substrate 100. At least one first reflector cup 310A includes a third reflection position 323. At least one second reflector cup 310B includes a fourth reflection position 324. The distance between the third reflection position 323 and the driving substrate 100 and the distance between the fourth reflection position 324 and the driving substrate 100 are the same. The included angle between the tangent at the third reflection position 323 and the plane where the driving substrate 100 is located is δ, and the included angle between the tangent at the second reflection position 324 and the plane where the driving substrate 100 is located is θ, where 0°<δ<θ≤90°.

In an embodiment, the reflector cups 310 include the first reflector cups 310A and the second reflector cups 310B. The first reflector cups 310A are located on the side of the second reflector cups 310B close to the edge of the driving substrate 100. At least one first reflector cup 310A includes a third reflection position 323. At least one second reflector cup 310B includes a fourth reflection position 324. The distance between the third reflection position 323 and the driving substrate 100 and the distance between the fourth reflection position 324 and the driving substrate 100 are the same, that is, the third reflection position 323 and the fourth reflection position 324 have the same height. For example, included angle δ between the tangent at the third reflection position 323 and the plane where the driving substrate 100 is located and included angle θ between the tangent at the fourth reflection position 324 and the plane where the driving substrate 100 is located satisfy $0°<\delta<\theta\leq90°$. That is, the first reflector cup 310A and the second reflector cup 310B are formed shown in FIG. 22. The shape trend of the first reflector cup 310A and the shape trend of the second reflector cup 310B are different, so that the light emission requirements of the light-emitting panel 10 at different positions are satisfied. Based on the shape of a reflector cup 310, the solution in the embodiments of the present disclosure can emit more light emitted by the light-emitting elements 200 from the vicinity of the reflector cups 310. Thus, the light output uniformity is further improved, and the problem of poor light output uniformity of the light-emitting panel 10 is alleviated. That is, the shape of the reflector cup 310 is appropriately disposed, so that it is possible to ensure that light reflected by the reflector cup 310 is emitted from the light output side of the light-emitting panel 10.

Optionally, the driving substrate 100 includes a special-shaped-edge driving substrate.

With continued reference to FIGS. 7, 10, 11, and 20, the shape of the driving substrate 100 is regular. For example, with continued reference to FIGS. 12, 13, 15, 16, 17, and 18, the driving substrate 100 also includes a special-shaped edge driving substrate. Only an irregular-edge driving substrate 100 is shown in a figure. Actually, the specific shapes of the special-shaped edge driving substrate are varied, and other shapes are not enumerated here. The light-emitting panel 10 provided by the embodiments of the present disclosure may satisfy various shapes of driving substrates 100, so that it is ensured that the light-emitting panel 10 can ensure the overall light-emitting effect under any shape of the driving substrate 100.

For example, under the special-shaped edge driving substrate 100, the defined region of the reflector cup 310 close to the edge of the driving substrate 100 may be greater than the defined region of the reflector cup 310 close to the center of the driving substrate 100, so that the light-emitting effect of an edge region can be improved, and the difference between the light-emitting effect of the edge region and the light-emitting effect of the central region caused by the irregular shape driving substrate 100 of the light-emitting panel 10 can be avoided. That is, the difference between the light-emitting effect of the edge of the light-emitting panel 10 and the light-emitting effect of the central region of the light-emitting panel 10 is weakened, and the overall light-emitting effect of the light-emitting panel 10 is ensured.

Figure 23:
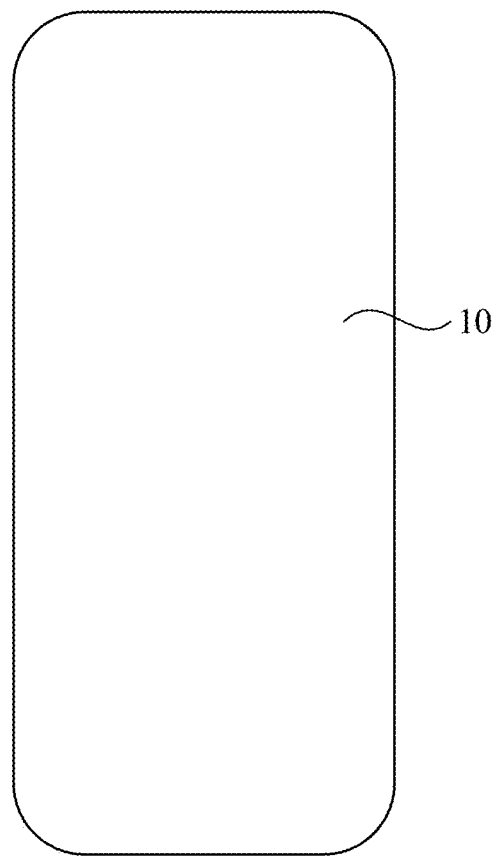
FIG. 23 is a view illustrating the structure of a display device according to an embodiment of the present disclosure.

Based on the same inventive concept, the embodiments of the present disclosure also provide a display device. The display device includes the display panel provided in the preceding embodiments. In an embodiment, FIG. 23 is a view illustrating the structure of a display device according to an embodiment of the present disclosure. As shown in FIG. 23, a display device 1 includes the light-emitting panel 10.

The display device 1 provided in the embodiments of the present disclosure has the technical effects of the technical solutions in any of the preceding embodiments. The explanations of the structures and terms that are the same as or corresponding to those in the preceding embodiments are not repeated here. The display device 1 provided in the embodiments of the present disclosure may be the phone shown in FIG. 23, or may be any electronic product with the display function, including but not limited to the following categories: a television, a laptop, a desktop display, a tablet computer, a digital camera, a smart bracelet, smart glasses, a vehicle-mounted display, a medical device, an industrial control device, and a touch interactive terminal, and no special limitations are made thereto in the embodiments of the present disclosure.

Figure 24:
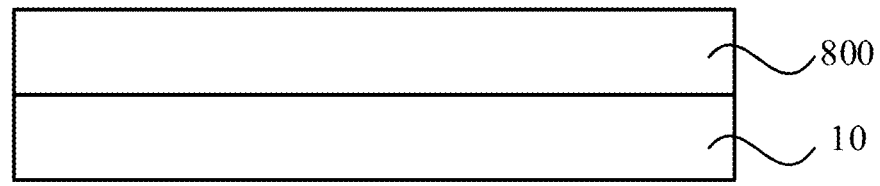
FIG. 24 is a diagram illustrating the structure of a backlight module according to an embodiment of the present disclosure.

Based on the same inventive concept, an embodiment of the present disclosure provides a backlight module. FIG. 24 is a diagram illustrating the structure of a backlight module according to an embodiment of the present disclosure. As shown in FIG. 24, the backlight module 2 includes the light-emitting panel 10 according to any embodiment of the present disclosure and also includes an optical film 800 located on the light output side of the light-emitting panel 10. For example, the optical film 800 may include stacked optical films such as diffusion films, brightness enhancement films, and uniform light films, which are beneficial to improving the light output effect of the backlight module 2. The specific structure of the optical film 800 is not limited in this embodiment of the present disclosure. The backlight module 2 provided in this embodiment of the present disclosure has the technical effects of the technical solutions in any of the preceding embodiments. The explanations of the structures and terms that are the same as or corresponding to those in the preceding embodiments are not repeated here.

Figure 25:
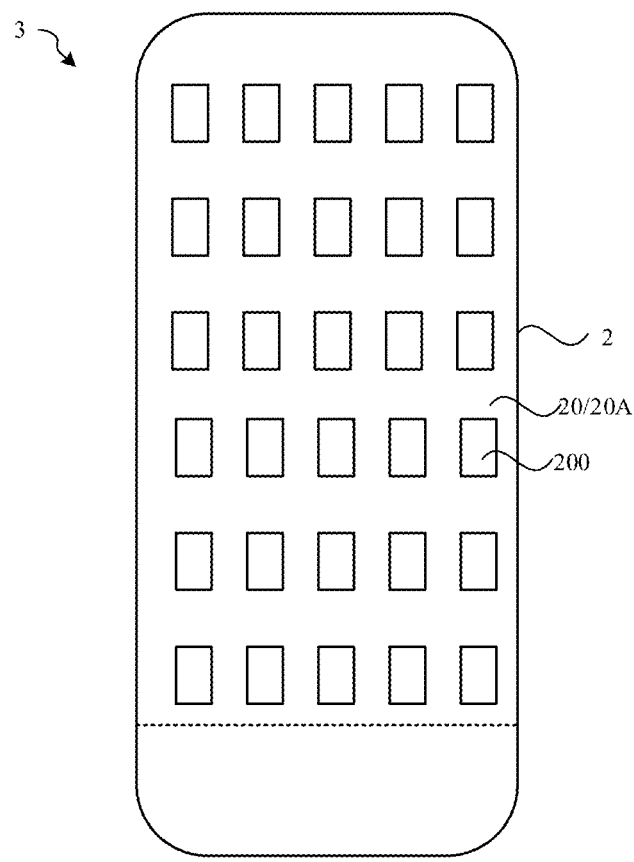
FIG. 25 is a diagram illustrating the structure of another display device according to an embodiment of the present disclosure.

Based on the same inventive concept, an embodiment of the present disclosure provides a display device. FIG. 25 is a diagram illustrating the structure of another display device according to an embodiment of the present disclosure. As shown in FIG. 25, the display device 3 includes the backlight module 2 described in any of the preceding embodiments and the display panel 20 located on the light output side of the backlight module 2. The display panel includes a display region 20A. The orthogonal projection of a light-emitting element 200 in the display panel 20 coincides with the display region 20A, so that light emitted by the light-emitting element 200 is incident into the display region 20A. Therefore, the display device 3 provided in this embodiment of the present disclosure has the corresponding beneficial effects in the preceding embodiments, and the details are not repeated here. Exemplarily, the display device 3 may be a mobile phone, a computer, a smart wearable device (for example, a smart watch), an onboard display device, and other electronic devices. This is not limited in this embodiment of the present disclosure.

It is to be noted that the preceding are only preferred embodiments of the present disclosure and the technical principles used therein. It is understood by those skilled in the art that the present disclosure is not limited to the specific embodiments described herein and that the features of the various embodiments of the present disclosure may be coupled or combined in part or in whole with each other and may be collaborated with each other and technically driven in various ways. Those skilled in the art can make various apparent modifications, adaptations, combinations and substitutions without departing from the scope of the present disclosure. Therefore, while the present disclosure is described in detail in connection with the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A light-emitting panel, comprising a driving substrate and a plurality of light-emitting elements located on a side of the driving substrate, wherein the plurality of light-emitting elements comprise first light-emitting elements on a side of the driving substrate close to an edge of the driving substrate, a minimum distance between the first light-emitting elements and the edge of the driving substrate is L1, and a minimum distance between two adjacent light-emitting elements of the plurality of light-emitting elements is L2, wherein 0<L1≤L2/2.

2. The light-emitting panel according to claim 1, wherein a distance between the two adjacent light-emitting elements is the same.

3. The light-emitting panel according to claim 1, wherein each first light-emitting element of the first light-emitting elements comprises a light-emitting surface, the light-emitting panel comprises a light output surface, and in a thickness direction of the light-emitting panel, a distance between the light-emitting surface and the light output surface is H; and an included angle between a maximum intensity light output direction of the each first light-emitting element and the thickness direction of the light-emitting panel is α, wherein the minimum distance L1 between the each first light-emitting element and the edge of the driving substrate satisfies L1=tan(α)*H.

4. The light-emitting panel according to claim 1, further comprising a reflection structure, wherein the reflection structure comprises a plurality of reflector cups, and the plurality of light-emitting elements are disposed in defined regions of the plurality of reflector cups;

the plurality of reflector cups comprise first reflector cups and second reflector cups, and the first reflector cups are located on a side of the second reflector cups close to the edge of the driving substrate; and in a thickness direction of the light-emitting panel, a height of each of the first reflector cups is less than a height of each of the second reflector cups.

5. The light-emitting panel according to claim 4, wherein in a direction from an edge of the light-emitting panel to a center of the light-emitting panel, heights of a plurality of second reflector cups increase.

6. The light-emitting panel according to claim 4, wherein in a direction from an edge of the light-emitting panel to a center of the light-emitting panel, a plurality of second reflector cups have the same height.

7. The light-emitting panel according to claim 1, further comprising a reflection structure, wherein the reflection structure comprises a plurality of reflector cups, and the plurality of light-emitting elements are disposed in defined regions of the plurality of reflector cups; and the plurality of reflector cups comprise third reflector cups and fourth reflector cups, the third reflector cups are located on a side of the fourth reflector cups close to the edge of the driving substrate, and a defined region of each of at least part of the third reflector cups is greater than a defined region of each fourth reflector cup of the fourth reflector cups.

8. The light-emitting panel according to claim 7, wherein the third reflector cups comprise first reflector sub-cups, an area of a defined region of each first reflector sub-cup of the first reflector sub-cups is S1, and an area of a defined region of one of other reflector cups of the plurality of reflector cups is S2, wherein S1/S2≥1.5; and a number of light-emitting elements in the defined region of the each first reflector sub-cup is greater than a number of light-emitting elements in the defined region of the each fourth reflector cup.

9. The light-emitting panel according to claim 8, wherein a plurality of light-emitting elements in the defined region of the each first reflector sub-cup are uniformly disposed.

10. The light-emitting panel according to claim 7, wherein the third reflector cups comprise at least one second reflector sub-cup, and a defined region of each second reflector sub-cup of the at least one second reflector sub-cup is greater than a defined region of one of other reflector cups of the plurality of reflector cups; and a number of light-emitting elements in the defined region of the each second reflector sub-cup is equal to a number of light-emitting elements in the defined region of the each fourth reflector cup.

11. The light-emitting panel according to claim 10, wherein the plurality of reflector cups comprise reflector cup walls, and the each second reflector sub-cup comprises a first reflector cup wall close to a side of the other reflector cups; and a height of at least part of the first reflector cup wall is less than a height of other reflector cup walls.

12. The light-emitting panel according to claim 1, further comprising a reflection structure, wherein the reflection structure comprises a plurality of reflector cups, and the plurality of light-emitting elements are disposed in defined regions of the plurality of reflector cups;

the plurality of reflector cups comprise fourth reflector cups and at least one fifth reflector cup, each fifth reflector cup of the at least one fifth reflector cup is located on a side of the fourth reflector cups close to the edge of the driving substrate, and a defined region of the each fifth reflector cup is less than a defined region of each fourth reflector cup of the fourth reflector cups and greater than a disposition region of a light-emitting element of the plurality light-emitting elements; and the each fifth reflector cup is provided with the light-emitting element disposed in a central region.

13. The light-emitting panel according to claim 1, further comprising a reflection structure, wherein the reflection structure comprises a plurality of reflector cups, and the plurality of light-emitting elements are disposed in defined regions of the plurality of reflector cups;

the plurality of reflector cups comprise at least one sixth reflector cup and seventh reflector cups, each sixth reflector cup of the at least one sixth reflector cup is located on a side of the seventh reflector cups close to the edge of the driving substrate, and a second reflector cup wall is shared between the each sixth reflector cup and another reflector cup of the plurality reflector cups adjacent to the each sixth reflector cup; and a gap exists between the second reflector cup wall and the edge of the driving substrate, or a gap exists between the second reflector cup wall and a reflector cup wall of a reflector cup of other reflector cups of the plurality reflector cups.

14. The light-emitting panel according to claim 1, further comprising a reflection structure, wherein the reflection structure comprises a plurality of reflector cups, and the plurality of light-emitting elements are disposed in defined regions of the plurality of reflector cups;

the plurality of reflector cups comprise at least one eighth reflector cup and ninth reflector cups, each eighth reflector cup of the at least one eighth reflector cup is located on a side of a ninth reflector cup of the ninth reflector cups close to the edge of the driving substrate, and a third reflector cup wall is shared between the each eighth reflector cup and another reflector cup of the plurality reflector cups adjacent to the each eighth reflector cup; and the third reflector cup wall comprises a first cup wall section and a second cup wall section connected to each other, and in a thickness direction of the light-emitting panel, a height of the first cup wall section is less than a height of the second cup wall section.

15. The light-emitting panel according to claim 14, wherein the each eighth reflector cup comprise a third reflector sub-cup, a fourth reflector sub-cup, and a fifth reflector sub-cup;

the third reflector cup wall comprises a first reflector cup sub-wall and a second reflector cup sub-wall;

the third reflector sub-cup and the fourth reflector sub-cup share the first reflector cup sub-wall, and the fourth reflector sub-cup and the fifth reflector sub-cup share the second reflector cup sub-wall;

distribution density of light-emitting elements in a defined region of the third reflector sub-cup is greater than distribution density of light-emitting elements in a defined region of the fifth reflector sub-cup; and a ratio of a length of a first cup wall section in the first reflector cup sub-wall to a length of a second cup wall section in the first reflector cup sub-wall is a, and a ratio of a length of a first cup wall section in the second reflector cup sub-wall to a length of a second cup wall section in the second reflector cup sub-wall is b, wherein $a>b$.

16. The light-emitting panel according to claim 14, wherein the first cup wall section of the third reflector cup wall is located on a side of the second cup wall section of the third reflector cup wall close to the edge of the driving substrate.

17. The light-emitting panel according to claim 1, further comprising a reflection structure, wherein the reflection structure comprises a plurality of reflector cups, and the plurality of light-emitting elements are disposed in defined regions of the plurality of reflector cups;

at least one reflector cup of the plurality of reflector cups comprises a reflective curved surface on a side of the reflector cup close to one of the plurality of light-emitting elements;

the reflective curved surface comprises a first reflection position and a second reflection position, the first reflection position is located on a side of the second reflection position close to the driving substrate, and the first reflection position is located on a side of the second reflection position close to the light-emitting element; and an included angle between a tangent at the first reflection position and a plane where the driving substrate is located is $\alpha$, and an included angle between a tangent at the second reflection position and the plane where the driving substrate is located is $\beta$, wherein $0°<\alpha<\beta\leq90°$.

18. The light-emitting panel according to claim 17, wherein the plurality of reflector cups comprise a plurality of first reflector cups and a plurality of second reflector cups, and the first reflector cups are located on a side of the second reflector cups close to the edge of the driving substrate;

at least one first reflector cup of the plurality of first reflector cups comprises a third reflection position, at least one second reflector cup of the plurality of second reflector cups comprises a fourth reflection position, and a distance between the third reflection position and the driving substrate is the same as a distance between the fourth reflection position and the driving substrate; and an included angle between a tangent at the third reflection position and the plane where the driving substrate is located is $\delta$, and the included angle between the tangent at the fourth reflection position and the plane where the driving substrate is located is $\theta$, wherein $0°<\delta<\theta\leq90°$.

19. The light-emitting panel according to claim 1, wherein the driving substrate comprises a special-shaped edge driving substrate; or wherein the plurality of light-emitting elements comprise micro light-emitting elements.

20. A display device, comprising a light-emitting panel, wherein the light-emitting panel comprises a driving substrate and a plurality of light-emitting elements located on a side of the driving substrate, wherein the plurality of light-emitting elements comprise first light-emitting elements on a side of the driving substrate close to an edge of the driving substrate, a minimum distance between the first light-emitting elements and the edge of the driving substrate is L1, and a minimum distance between two adjacent light-emitting elements of the plurality of light-emitting elements is L2, wherein $0<L1\leq L2/2$.

* * * * *